July 2, 1929. W. G. CADY Re. 17,358

PIEZO ELECTRIC RESONATOR

Original Filed Jan. 28, 1920

INVENTOR
WALTER G. CADY
by
David Rines
ATTORNEY

Reissued July 2, 1929. Re. 17,358

UNITED STATES PATENT OFFICE.

WALTER G. CADY, OF MIDDLETOWN, CONNECTICUT, ASSIGNOR TO RADIO CORPORATION OF AMERICA, A CORPORATION OF DELAWARE.

PIEZO-ELECTRIC RESONATOR.

Original No. 1,450,246, dated April 3, 1923, Serial No. 354,659, filed January 28, 1920. Application for reissue filed August 6, 1925. Serial No. 48,680.

DIVISION D.

The present invention relates to electrical systems, and more particularly to electric filters.

Figure 1:
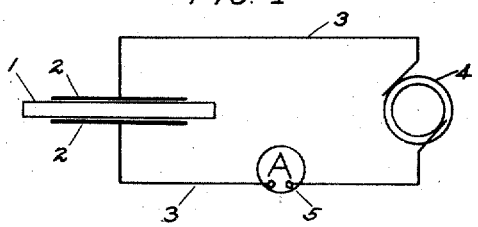

The nature and the objects of the invention will be explained in connection with the accompanying drawings, in which Fig. 1 is a diagrammatic view of a circuit and apparatus illustrating the principles underlying the present invention; and Figs. 2 to 5, inclusive, are similar views, illustrating several forms of the invention.

For many years it has been known that quartz, tourmaline and certain other crystals, if compressed or otherwise strained in certain directions, respond electrically, so as to exhibit positive and negative electrification in certain regions on their surfaces. It has also been known that the converse effect obtains, that is to say, that such crystals, when electrically stimulated, as by being placed in an electric field, become deformed. This phenomenon has been known as piezo-electricity. In the specification and the claims, the action of the electric forces to cause mechanism deformation will, for brevity, be called "stimulation"; and the development of the electromotive force by the deformation will be called "response". A large number of both natural and artificial crystals have been found to possess this piezo-electric property. The general knowledge on the subject has so far developed that it is now possible to predict in advance whether a given crystal will show the piezo-electric effect, and in what manner a plate or rod should be cut from the crystal in order to exhibit this effect to the greatest possible degree.

The crystal that has been most commonly employed in piezo-electric experiments, in the past, has been quartz. As a rule, investigators have used thin, flat plates or rods of quartz rectangular in cross section, and coated on their opposite faces with tinfoil coatings 2.

As is explained in my application, Serial No. 20,277, filed April 2, 1925, for reissue of my Letters Patent No. 1,450,246, of which my present application is a division, a plate or rod 1, suitably cut from a piezo-electric crystal according to approved practice, and provided with conductive coatings 2 that are connected with a source of high-frequency current 4, by conductors 3, as shown in Fig. 1, becomes set into vibration at various frequencies of the alternating current. The amplitude of such forced vibrations is exceedingly minute, except when the frequency of the current approximates a natural frequency of mechanical vibration of the plate. Even at this natural frequency the changes in the dimensions of the plate resulting from its forced vibrations are so minute as to escape detection under ordinary conditions. They are nevertheless sufficient to exert a marked reaction upon the electric current. At the critical frequency, the absorption of energy in the plate causes the current in the circuit to pass through a minimum. If the frequency of the current be increased, for example, the current traversing the circuit, as measured by an ammeter 5 in series with the coatings, will be found to pass through a maximum at a frequency slightly below the resonant frequency, followed by a minimum at a frequency slightly above the resonant frequency. If the frequency be decreased, this process will be reversed. The reactions of the crystal upon the current are such that, with a tube-generating circuit, as commonly employed, it is usually impossible to make the circuit oscillate at exactly the natural frequency of vibration of the crystal when the crystal is connected directly in the circuit, but the frequency at which the above-mentioned minimum occurs is so close to the natural frequency that, for most practical purposes, it may be regarded as the natural frequency of the crystal. The theory will be found explained at greater length in the above-named application and in my paper in the Proceedings of the Institute of Radio Engineers, vol. 10, April, 1922.

When the plate is made from a piezo-electric crystal of good elastic qualities, such as quartz, when its width is small in comparison with its length, and it is mounted in such manner that its vibrations will be damped as little as possible, the reaction is extremely sharp and very pronounced. Such a plate, connected to a source of electric oscillations of variable frequency, will respond when one and only one frequency—neglecting for the moment overtones—is being generated. It forms a piezo-electric resonator, somewhat analogous to the acoustical resonators of Helmholtz.

It is not necessary that the device comprise a long, narrow plate, although this has its advantages in permitting greater sharpness of tuning, and in securing greater freedom from effects that might be produced by undesired modes of vibration. The plate may have various shapes, or some other form than a plate may be used, including the entire native crystal itself. In fact, it is within the scope of the present invention to use other electro-mechanical vibrators than piezo-electric crystals. The only essential condition is that the vibrator shall be mounted and connected to an oscillating circuit of variable frequency in such a manner as to react electrically upon such circuit at a particular frequency. In general, the more complicated the form, the more numerous are the frequencies to which the unit will respond.

Figure 2:
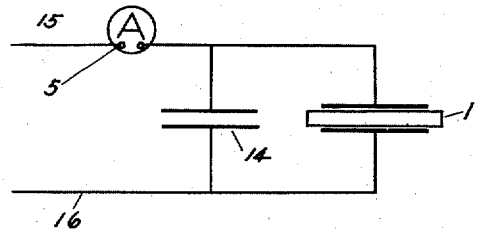

According to the present invention, the piezo-electric resonator is used to produce a large impedance or reactance in an alternating-current circuit at a certain particular frequency or frequencies. The current in the circuit is thus reduced to as low a value as possible at a critical frequency. In Fig. 2, for example, the piezo-electric resonator 1 is connected in parallel with a condenser 14, which may form part of any tuned oscillatory circuit in which alternating current of variable frequency is flowing. The wires 15 and 16 connect the condenser 14 with the remainder of the circuit, through an ammeter 5. At a critical frequency, the absorption of energy in the piezo-electric resonator causes the current in the ammeter to pass through a minimum. This decrease in current is the greater, the smaller the capacity of the condenser with respect to that of the resonator.

The current flowing to the crystal body does not sink to a simple minimum at resonance, but as the frequency is increased, it passes through a maximum, followed by a minimum, with a possible secondary maximum and minimum lying in-between. For this reason, when it is desired to reduce a current to a minimum at a predetermined frequency, the current in question should be either that through the ammeter 5 in Fig. 2 or else that flowing to condenser 14 in the same figure, since in the latter case the current falls in general to a simple minimum at resonance. Similarly, in Fig. 5, the current passes through a minimum at resonance in the ammeter 21, and also in the condenser 10. This is explained in my said paper in the Proceedings of the Institute of Radio Engineers, pages 99 to 101.

This circuit constitutes a piezo-electric filtering circuit, and, as is well known to be the case with all narrow-band filtering circuits, it is an advantage to have the electrical resistance as low as possible.

The resonator should preferably not be connected in series with the oscillating circuit, since its capacity is so small that it would destroy the tuning. It is usually connected in parallel with the tuning condenser. The alternating current traversing the circuit thus divides, part passing through the condenser 14 and the remainder through the crystal 1.

Figure 3:
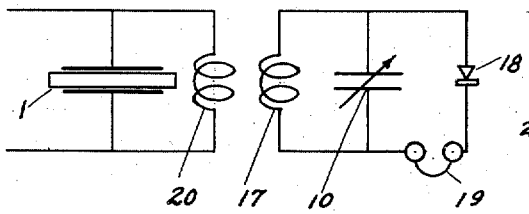

In Fig. 3 the piezo-electric resonator 1 forms part of an oscillatory circuit loosely coupled to a tuned circuit comprising a coil 17 and a condenser 10. In parallel with the latter, is a detector 18 and a telephone receiver 19, or some other indicating device may be properly connected with the current. When the resonator is connected in parallel with the coil 20 in the first circuit and the frequency of the alternating current is varied through the critical value, the sudden reaction of the resonator upon the current in 20 produces an audible click in the telephone 19. It is not generally necessary that the circuit of coil 17 should be in exact tune with that containing 20.

Figure 4:
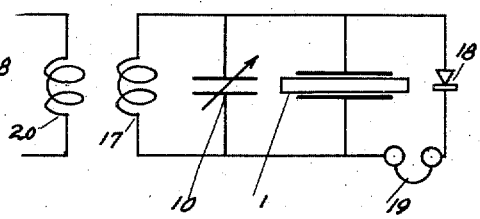

Fig. 4 illustrates the same plan as the preceding figure, but, in this case, the piezo-electric resonator is in parallel with the condenser 10 in the receiving circuit, instead of being in parallel with coil 20.

The operation is the same as described in connection with Fig. 3, except that the crystal reacts upon the receiving circuit, comprising the coil 17 and the condenser 10.

As before explained, this connection of the resonator is parallel with the capacity in a secondary circuit is found, is practice, to be the best for filter-purposes. The tuning condenser in parallel with the crystal and the resistance of the circuit should have as low values as possible.

Figure 5:
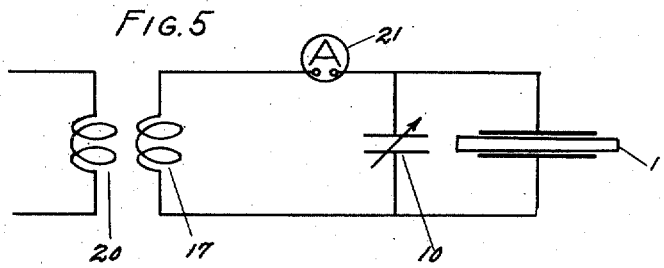

Fig. 5 is similar to Figs. 3 and 4, except that instead of the detector and the telephone, there is shown a high frequency ammeter 21. By varying the frequency of the current in coil 20, and keeping the secondary circuit, which comprises the coil 17 and a variable condenser 10, in electrical resonance with the current in 20, it is possible to observe quantitatively the manner in which the current in the ammeter passes through a minimum at the critical frequency, and to determine the settings of condensers and other instruments corresponding to this frequency, with a high degree of precision.

It will be understood that the invention is not restricted to the exact embodiments thereof that are illustrated and described herein, as other modifications will readily occur to persons skilled in the art, and all such as considered to fall within the spirit and scope of the invention, as defined in the appended claims.

What I claim as my invention is:

1. The method of filtering an undulating current of a predetermined frequency from an alternating current circuit, which comprises converting said undulations into mechanical vibrations, reconverting said mechanical vibrations into electrical undulations having said predetermined frequency, utilizing said last mentioned undulations to oppose said first mentioned undulations, whereby the latter are choked back from the circuit.

2. The method of filtering an undulating current of a predetermined frequency from an alternating current circuit, which comprises utilizing said undulations to produce other electrical undulations opposite in phase to said first mentioned undulations, and utilizing said other electrical undulations to choke back said first mentioned undulations, whereby said first mentioned undulations are wiped out of said circuit.

3. An electric-wave filter comprising an electro-mechanical vibrator adapted to vibrate mechanically when stimulated electrically and to respond electrically by generating an alternating current potential when vibrated mechanically.

4. An electric-wave filter comprising a piezo-electric body.

5. An electric-wave filter comprising a piezo-electric plate or rod having axes of structural symmetry of uniform orientation.

6. An electric-wave filter comprising an alternating-current circuit, and a piezo-electric plate or rod having axes of structural symmetry of uniform orientation for reducing the flow of current in the circuit, the plate or rod being so designed that a natural frequency of mechanical vibration of the plate or rod shall be substantially equal to the frequency of the current to be filtered and so mounted that its mechanical vibrations shall be damped to substantially the least possible extent.

7. An electric-wave filter comprising an alternating-current circuit and a quartz plate or rod so designed that it shall react electrically upon the current flowing in the circuit at a predetermined frequency of the current.

8. An electric-wave filter comprising an alternating-current circuit in which currents of different frequencies are adapted to flow, and an electro-mechanical vibrator having a natural period and adapted to vibrate mechanically when stimulated electrically, the vibrator being so designed as to filter out from the system a current of a frequency substantially equal to said natural period.

9. An electric-wave filter comprising an alternating-current circuit in which currents of different frequencies are adapted to flow, and a piezo-electric body designed to filter out from the circuit a current of a predetermined frequency.

10. An electric-wave filter comprising an alternating-current circuit and a piezo-electric body for reducing the flow of current in the circuit, the body being so designed that a natural frequency of mechanical vibration of the body shall be substantially equal to the frequency of the current to be filtered, and so mounted that its mechanical vibrations shall be damped to substantially the least possible extent.

11. An electric-wave filter comprising an alternating-current circuit and an electro-mechanical vibrator connected in parallel with an element of the circuit, the vibrator being adapted to vibrate mechanically when stimulated electrically and to respond electrically by generating an alternating current potential when vibrated mechanically.

12. An electric-wave filter comprising an alternating-current circuit in which currents of different frequencies are adapted to flow and a piezo-electric body connected in parallel with an element of the circuit, the body being so designed that a natural frequency of mechanical vibration of the body shall be substantially equal to a predetermined frequency of the current, whereby the current at the predetermined frequency is reduced to a minimum.

13. An electric-wave filter comprising an alternating-current circuit in which currents of different frequencies are adapted to flow, and a piezo-electric plate or rod having axes of structural symmetry of uniform orientation connected in parallel with an element of the circuit, whereby the current flowing in the circuit is reduced to a minimum at a frequency of the current that is substantially equal to the natural frequency of mechanical vibration of the plate or rod.

14. An electric-wave filter comprising an alternating-current circuit having an inductance, and a piezo-electric body connected in parallel with the inductance.

15. An electric-wave filter comprising an alternating-current system having a condenser and a piezo-electric body connected in parallel with the condenser, the body being so designed that the current flowing in the system shall be reduced to a minimum at a predetermined frequency of the current, the capacity of the condenser being as small as possible with respect to the capacity of the body.

16. An alternating-current system comprising an inductance, and an electro-mechanical vibrator adapted to vibrate mechanically when stimulated electrically and to respond electrically when vibrated mechanically, the vibrator being connected in parallel to the inductance, the vibrator being so designed that the current flowing in the system shall be reduced to a minimum at a predetermined frequency of the current.

17. An electric-wave filter comprising an alternating-current circuit having a variable inductance, whereby the circuit may be tuned, an electro-mechanical vibrator for reducing the flow of current in the circuit, the vibrator being adapted to vibrate mechanically when stimulated electrically and to respond electrically when vibrated mechanically, the vibrator being connected in parallel with the inductance and being so designed that a natural frequency of mechanical vibration of the vibrator shall be substantially equal to the frequency of the current that it is desired to filter.

18. An electric-wave filter comprising an alternating-current circuit having a variable inductance, whereby the circuit may be tuned, a piezo-electric body for reducing the flow of current in the circuit, the body being connected in parallel with the inductance and being so designed that a natural frequency of mechanical vibration of the body shall be substantially equal to the frequency of the current that it is desired to filter, and the body being so mounted that its mechanical vibrations shall be damped to substantially the least possible extent.

19. An electric-wave filter comprising an alternating-current receiving circuit in which currents of variable frequency are adapted to be received, and an electro-mechanical vibrator adapted to vibrate mechanically when stimulated electrically and to respond electrically by generating an alternating current potential when vibrated mechanically, the vibrator being connected with the receiving circuit and so designed that a natural frequency of mechanical vibration of the vibrator shall be substantially equal to a predetermined frequency of the current flowing in the receiving circuit.

20. An electric-wave filter comprising an alternating-current system having two coupled circuits and a piezo-electric body connected with one of the circuits.

21. An electric-wave filter comprising an alternating-current system having two coupled circuits, a piezo-electric body connected with one of the circuits, and means for varying the frequency of the current in one of the circuits.

22. An electric-wave filter comprising an alternating-current system having two electrically coupled circuits, whereby current will be induced in one of the circuits when current is flowing in the other circuit, the said other circuit comprising a tuning condenser and a piezo-electric body connected in parallel with the condenser, the capacity of the condenser being as small as possible with respect to the capacity of the body, and the body being so designed that a natural frequency of mechanical vibration of the body shall be substantially equal to a predetermined frequency of the current flowing in the said other circuit, whereby the current flowing in a branch of the said other circuit shall be reduced to a minimum at the predetermined frequency of the current, whereby a current of the predetermined frequency will be filtered out of the said branch of the said other circuit, and the body being so mounted that its mechanical vibrations shall be damped to the least possible extent.

23. An electric-wave filter comprising an alternating-current system having two electrically coupled circuits, an electro-mechanical vibrator connected with one of the circuits, the vibrator being adapted to vibrate mechanically when stimulated electrically and to respond electrically when vibrated mechanically, the vibrator being so designed and connected that a natural frequency of mechanical vibration of the vibrator shall be substantially equal to the frequency of the current in the said one circuit, and means for causing current to flow in one of the two circuits, whereby a minimum current will be caused to flow in the other of the two circuits when the current flowing in the first-named said one circuit is at the said frequency.

24. An electric-wave filter comprising an alternating-current system having two circuits each having a coil, and an electro-mechanical vibrator connected with one of the circuits, the vibrator being adapted to vibrate mechanically when stimulated electrically and to respond electrically when vibrated mechanically, the vibrator being so designed that a natural frequency of mechanical vibration of the vibrator shall be substantially equal to the frequency of the current in the said one circuit, the coils being coupled together, whereby the current flowing in the other circuit will be reduced to a minimum at the said frequency of the current of the said one circuit.

25. An electric-wave filter comprising an alternating-current system comprising two electrically coupled circuits, one of the circuits having a coil, an electro-mechanical vibrator connected in parallel with the coil, the vibrator being adapted to vibrate mechanically when stimulated electrically and to respond electrically when vibrated mechanically, the vibrator being so designed that the current flowing in the said one circuit shall be reduced to a minimum at a predetermined frequency of the current of the said one circuit, and means for tuning one of the circuits, whereby the current flowing in one of the two circuits will be reduced to a minimum when the current flowing in the other of the two circuits is at the predetermined frequency.

26. An electric-wave filter comprising an alternating-current system having two electrically coupled circuits, an electro-mechanical vibrator connected with one of the circuits, the vibrator being adapted to vibrate mechanically when stimulated electrically and to respond electrically when vibrated mechanically, the vibrator being so designed that a natural frequency of mechanical vibration of the vibrator shall be substantially equal to the frequency of the current of the said one circuit, and means for causing current at the said frequency to flow in the said one circuit, whereby a minimum current will be caused to flow in the other circuit.

27. An electric-wave filter comprising an alternating-current system having two electrically coupled circuits, an electro-mechanical vibrator connected with one of the circuits, the vibrator being adapted to vibrate mechanically when stimulated electrically and to respond electrically when vibrated mechanically, the vibrator being so designed that a natural frequency of mechanical vibration of the vibrator shall be substantially equal to the frequency of the current of the said one circuit, and means for causing current at the said frequency to flow in the other circuit, whereby a minimum current will be caused to flow in the said one circuit.

28. An electric-wave filter comprising an alternating-current system having two circuits, an electro-mechanical vibrator connected with one of the circuits, the vibrator being adapted to vibrate mechanically when stimulated electrically and to respond electrically when vibrated mechanically, the vibrator being so designed that a natural frequency of mechanical vibration of the vibrator shall be substantially equal to the frequency of the current of the said one circuit, the frequency in one of the two circuits being adapted to be varied, and means for varying the reactance of the other of the two circuits.

29. An electric-wave filter comprising two electrically coupled circuits, an electro-mechanical vibrator adapted to vibrate mechanically when stimulated electrically and to respond electrically when vibrated mechanically, the vibrator being so designed that a natural frequency of mechanical vibration of the vibrator shall be substantially equal to the frequency of the current in the said one circuit, means for causing current to flow in one of the two circuits, whereby a minimum current will be caused to flow in the other of the two circuits when the current flowing in the first-named said one circuit is at the said frequency, and means for detecting the current in the other of the two circuits.

30. An electric-wave filter comprising two electrically coupled circuits, one of the circuits having a coil, an electro-mechanical vibrator adapted to vibrate mechanically when stimulated electrically and to respond electrically when vibrated mechanically, the vibrator being connected in parallel with the coil, the vibrator being so designed that the current flowing in the said one circuit shall be reduced to a minimum at a predetermined frequency of the current of the said one circuit, whereby the current flowing in one of the two circuits will be reduced to a minimum when the current flowing in the other of the two circuits is at a predetermined frequency, and means for detecting the said minimum current.

31. An electric-wave filter comprising two electrically coupled circuits, a piezo-electric body connected with one of the circuits, the body being so designed that a natural frequency of mechanical vibration of the body shall be substantially equal to the frequency of the current in the said one circuit, means for causing current to flow in one of the two circuits, whereby a minimum current will be caused to flow in the other of the two circuits when the current flowing in the first-named said one circuit is at the said frequency, and means for detecting the current in the other of the two circuits.

32. An electric-wave filter comprising two electrically coupled circuits, one of the circuits having a coil, a piezo-electric body connected in parallel with the coil, the body being so designed that the current flowing in the said one circuit shall be reduced to a minimum at a predetermined frequency of the current of the said one circuit, whereby the current flowing in one of the two circuits will be reduced to a minimum when the current flowing in the other of the two circuits is at a predetermined frequency, and means for detecting the said minimum current.

33. An electric-wave filter comprising two circuits, a piezo-electric body connected with one of the circuits, the body being so designed that a natural frequency of mechanical vibration of the body shall be substantially equal to the frequency of the alternating current in the said one circuit, the frequency in one of the two circuits being adapted to be varied, means for maintaining the other of the two circuits in electrical resonance with the current in the said one of the two circuits, and means for indicating the current in the said other of the two circuits.

In testimony whereof, I hereunto affix my signature.

WALTER G. CADY.